United States Patent
Dong et al.

(10) Patent No.: US 12,431,052 B2
(45) Date of Patent: *Sep. 30, 2025

(54) ARRAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Xiangdan Dong, Beijing (CN); Yujing Li, Beijing (CN); Rong Wang, Beijing (CN); Fan He, Beijing (CN)

(73) Assignees: Chengdu BOE Optoelectronics Technology Co., Ltd., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/669,607

(22) Filed: May 21, 2024

(65) Prior Publication Data

US 2024/0304129 A1 Sep. 12, 2024

Related U.S. Application Data

(63) Continuation of application No. 17/781,865, filed as application No. PCT/CN2021/091505 on Apr. 30, 2021, now Pat. No. 12,020,616.

(51) Int. Cl.
G09G 3/00 (2006.01)
G09G 3/20 (2006.01)
H10K 59/131 (2023.01)

(52) U.S. Cl.
CPC ............ *G09G 3/20* (2013.01); *H10K 59/131* (2023.02); *G09G 2300/0408* (2013.01);
(Continued)

(58) Field of Classification Search
CPC ... G09G 2300/0426; G09G 2310/0297; G09G 2310/08; G09G 2330/12; G09G 3/20; H01L 27/124
See application file for complete search history.

(56) References Cited

U.S. PATENT DOCUMENTS

2019/0278145 A1* 9/2019 Tanaka ............ G02F 1/136286
2022/0005886 A1   1/2022 Jeong et al.
2022/0231055 A1* 7/2022 Qin .................... H10D 86/441

FOREIGN PATENT DOCUMENTS

CN 108873550 A 11/2018
CN 109445210 A 3/2019
(Continued)

OTHER PUBLICATIONS

International Search Report in PCT/CN2021/091505 in Chinese dated Dec. 1, 2021 with English translation.
(Continued)

*Primary Examiner* — Insa Sadio
(74) *Attorney, Agent, or Firm* — Collard & Roe, P.C.

(57) ABSTRACT

An array substrate and a display device are disclosed. In the array substrate, the base substrate includes a display region and a bonding region; the display region includes a first region and a second region, and the plurality of first pixel driving circuits are located in the second region, the plurality of first pixel driving circuits are arranged in an array along a first direction and a second direction to form a plurality of first pixel driving columns arranged along the first direction, the first region and the second region are arranged in the first direction, the plurality of first data lines are configured to provide data signals to the plurality of first pixel driving columns, and the plurality of first leads are respectively connected with the plurality of first data lines, and at least partially located in the first region and the second region.

20 Claims, 5 Drawing Sheets

(52) U.S. Cl.
CPC .............. *G09G 2300/0426* (2013.01); *G09G 2300/0819* (2013.01); *G09G 2300/0861* (2013.01); *G09G 2320/0209* (2013.01)

(56) References Cited

FOREIGN PATENT DOCUMENTS

| | | |
|---|---|---|
| CN | 109541865 A | 3/2019 |
| CN | 109791745 A | 5/2019 |
| CN | 111323949 A | 6/2020 |
| EP | 3 770 964 A1 | 5/1990 |
| EP | 3 716 002 A1 | 9/2020 |
| WO | 2020/091228 A1 | 5/2020 |

OTHER PUBLICATIONS

Written Opinion in PCT/CN2021/091505 in Chinese dated Dec. 1, 2021 with English translation.
Extended European Search Report in European Application No. 21938481.5 dated Nov. 24, 2023.
U.S. Notice of Allowance in U.S. Appl. No. 17/781,865 dated Feb. 20, 2024.

\* cited by examiner

ARRAY SUBSTRATE AND DISPLAY DEVICE

The present application is a continuation of U.S. Ser. No. 17/781,865 filed on Jun. 2, 2022, which is a national stage application of PCT international patent application No. PCT/CN2021/091505, filed on Apr. 30, 2021, the entire disclosure of which is incorporated herein by reference as part of the present application.

TECHNICAL FIELD

Embodiments of the present disclosure relate to an array substrate and a display device.

BACKGROUND

With the continuous development of display technology, people have higher and higher requirements for the display quality of display devices. Organic light emitting diode (OLED) display devices are widely used because of their advantages of wide color gamut, fast response speed, flexible display, flexibility and high contrast.

On the other hand, people have higher and higher requirements for the overall effect and display effect of organic light emitting diode (OLED) display devices. Narrow frame design and rounded corner design can significantly improve the overall effect and display effect of display devices, so these designs gradually become the development direction of the market and the research focus of major manufacturers.

SUMMARY

Embodiments of the present disclosure provide an array substrate and a display device. In the array substrate, the plurality of first leads pass through the first region from the second region and extend to the bonding region, instead of directly extending from the second region to the bonding region, and the array substrate does not need to set a wider frame outside the second region, thereby realizing a narrow frame design.

At least one embodiment of the present disclosure provides an array substrate, including: a base substrate, including a display region and a bonding region located around the display region; a plurality of first pixel driving circuits located on the base substrate; a plurality of first data lines; and a plurality of first leads, wherein the display region includes a first region and a second region located at a side of the first region, and the plurality of first pixel driving circuits are located in the second region, the plurality of first pixel driving circuits are arranged in an array along a first direction and a second direction to form a plurality of first pixel driving columns arranged along the first direction, the first region and the second region are arranged in the first direction, the plurality of first data lines are configured to provide data signals to the plurality of first pixel driving columns, and the plurality of first leads are respectively connected with the plurality of first data lines, pass through the first region from the second region and extend to the bonding region.

For example, in the array substrate provided by an embodiment of the present disclosure, each of the first pixel driving circuits includes a driving transistor, and the array substrate further includes: a light shielding structure located at a side of the plurality of first pixel driving circuits close to the base substrate, an orthographic projection of the driving transistor of each of the first pixel driving circuits on the base substrate is at least partially overlapped with an orthographic projection of the light shielding structure on the base substrate, and the plurality of first leads are arranged in a same layer as the light shielding structure.

For example, in the array substrate provided by an embodiment of the present disclosure, the driving transistor includes a channel region, an orthographic projection of the channel region on the base substrate completely falls within an orthographic projection of the light shielding structure on the base substrate, and each of the first leads is spaced apart from and insulated from the light shielding structure.

For example, the array substrate provided by an embodiment of the present disclosure further includes: a first conductive layer, located at a side of the plurality of first pixel driving circuits away from the base substrate; and a first via connection structure, the plurality of first data lines are located in the first conductive layer, and each of the first leads is connected with a corresponding one of the first data lines through the first via connection structure.

For example, the array substrate provided by an embodiment of the present disclosure further includes: a first conductive layer, located at a side of the plurality of first pixel driving circuits away from the base substrate; a first planarization layer, located at a side of the first conductive layer away from the base substrate; a second conductive layer, located at a side of the first planarization layer away from the base substrate; a second via connection structure; and a third via connection structure, located in the first planarization layer, the plurality of first data lines are located in the second conductive layer, and the first conductive layer includes a connection electrode, each of the first leads is connected with the connection electrode through the second via connection structure, and the connection electrode is connected with a corresponding one of the first data lines through the third via connection structure.

For example, in the array substrate provided by an embodiment of the present disclosure, each of the first leads includes: a first sub-lead portion, extending from the second region to the first region along the first direction; and a second sub-lead portion, extending from the first region to the bonding region along the second direction.

For example, the array substrate provided by an embodiment of the present disclosure further includes: a plurality of second pixel driving circuits located in the first region; and a plurality of first power lines extending along the second direction and at least partially located in the second region; and a plurality of second power lines extending along the second direction and at least partially located in the first region, the plurality of first pixel driving circuits are arranged in an array along a first direction and a second direction to form a plurality of first pixel driving rows arranged along the second direction and a plurality of first pixel driving columns arranged along the first direction, and the plurality of second pixel driving circuits are arranged in an array along a first direction and a second direction to form a plurality of second pixel driving rows arranged along the second direction and a plurality of second pixel driving columns arranged along the first direction, the first power lines are configured to provide power signals to the first pixel driving columns, the second power lines are configured to provide power signals to the second pixel driving columns, an orthographic projection of the second sub-lead portion of each of the first leads on the base substrate is at least partially overlapped with an orthographic projection of one of the second power lines on the base substrate.

For example, the array substrate provided by an embodiment of the present disclosure further includes a plurality of second pixel driving circuits located in the first region; a plurality of second data lines; a plurality of first power lines extending along the second direction and at least partially located in the second region; and a plurality of second power lines extending along the second direction and at least partially located in the first region, the plurality of first pixel driving circuits are arranged in an array along a first direction and a second direction to form a plurality of first pixel driving rows arranged along the second direction and a plurality of first pixel driving columns arranged along the first direction, and the plurality of second pixel driving circuits are arranged in an array along a first direction and a second direction to form a plurality of second pixel driving rows arranged along the second direction and a plurality of second pixel driving columns arranged along the first direction, the plurality of second data lines are configured to provide data signals to the plurality of second pixel driving columns, the plurality of first power lines are configured to provide power signals to the plurality of first pixel driving columns, the plurality of second power lines are configured to provide power signals to the plurality of second pixel driving columns, an orthographic projection of the second sub-lead portion of each of the first leads on the base substrate is located between an orthographic projection of one of the second data lines on the base substrate and an orthographic projection of one of the second power lines on the base substrate.

For example, in the array substrate provided by an embodiment of the present disclosure, lengths of first sub-lead portions of adjacent ones of first leads are approximately equal.

For example, in the array substrate provided by an embodiment of the present disclosure, each of the first pixel driving circuits further includes a compensation transistor and an initialization transistor, a first electrode of the compensation transistor, a first electrode of the initialization transistor and a gate electrode of the driving transistor are connected to a first node, an active layer of the compensation transistor and an active layer of the initialization transistor are made of an oxide semiconductor material, and an active layer of the driving transistor is made of a low-temperature polysilicon material.

For example, in the array substrate provided by an embodiment of the present disclosure, the second region is closer to an edge of the array substrate than the first region in the first direction.

For example, in the array substrate provided by an embodiment of the present disclosure, an edge of an orthographic projection of the second region on the base substrate includes a curve, and the curve is connected with an edge of an orthographic projection of the first region on the base substrate extending in the first direction.

For example, in the array substrate provided by an embodiment of the present disclosure, a first overlapping area of an orthographic projection of the bonding region on a reference line extending along the first direction and an orthographic projection of the first region on the reference line is larger than a second overlapping area of an orthographic projection of the bonding region on the reference line extending along the first direction and an orthographic projection of the second region on the reference line.

For example, in the array substrate provided by an embodiment of the present disclosure, the base substrate further includes a bending region located between the first region and the bonding region, and the bending region is bent so that the bonding region and the first region are located at both sides of the base substrate in the third direction, and the third direction is perpendicular to both the first direction and the second direction.

At least one embodiment of the present disclosure further provides a display device, which includes any one of the abovementioned array substrate.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The terms "connected" or "connected" are not limited to physical or mechanical connections, but can include electrical connections, whether direct or indirect.

In order to meet people's higher and higher requirements for the overall effect and display effect of display devices, narrow frame design and rounded corner design are gradually applied in display devices, such as smart phones. However, the display panel with rounded corner design needs to be wired outside the rounded corner region, so the common display device needs a wider frame outside the rounded corner region.

Figure 1:
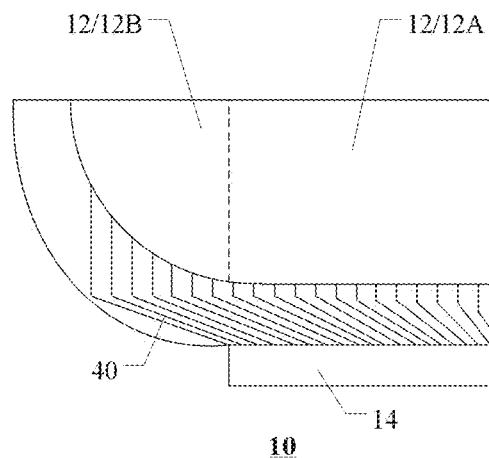
FIG. 1 is a partial schematic diagram of an array substrate.

FIG. 1 is a partial schematic diagram of an array substrate. As illustrated by FIG. 1, an array substrate 10 uses leads 40 to connect data lines in a display region 12 with a bonding region 14, so that data signals can be provided to pixel driving circuits in the display region 12 through the bonding region 14 and the leads 40. In the array substrate 10, a large number of leads 40 need to be arranged outside a rounded corner region 12B of the display region 12, and the large number of leads 40 need to be bent to be connected to the bonding region 14, so a wider frame is needed outside the rounded corner region 12B for the leads 40 to be wired. On the other hand, in this array substrate 10, because it is needed to make way for the leads 40 of the rounded corner region 12B, the leads 40 of a rectangular region 12A of the display region 12 also need to be bent to be connected to the bonding region, so a wider frame is also needed outside the rectangular region 12A of the display region 12.

Therefore, the embodiments of the present disclosure provide an array substrate and a display device. The array substrate includes a base substrate, a plurality of first pixel driving circuits, a plurality of first data lines and a plurality of first leads; the base substrate includes a display region and a bonding region around the display region; the plurality of first pixel driving circuits are located on the base substrate; the display region includes a first region and a second region located at a side of the first region, and a plurality of first pixel driving circuits are located in the second region; the plurality of first pixel driving circuits are arranged in an array along the first direction and the second direction to form a plurality of first pixel driving columns arranged along the first direction; the plurality of first data lines are configured to provide data signals to the plurality of first pixel driving columns, and the plurality of first leads are respectively connected with the plurality of first data lines, passing through the first region from the second region and extending to the bonding region. Therefore, the plurality of first leads pass through the first region from the second region and extend to the bonding region, instead of directly extending from the second region to the bonding region, and the array substrate does not need to set a wider frame outside the second region, thereby realizing a narrow frame design.

Hereinafter, the array substrate and the display device provided by the embodiment of the present disclosure will be described in detail with reference to the attached drawings.

Figure 2:
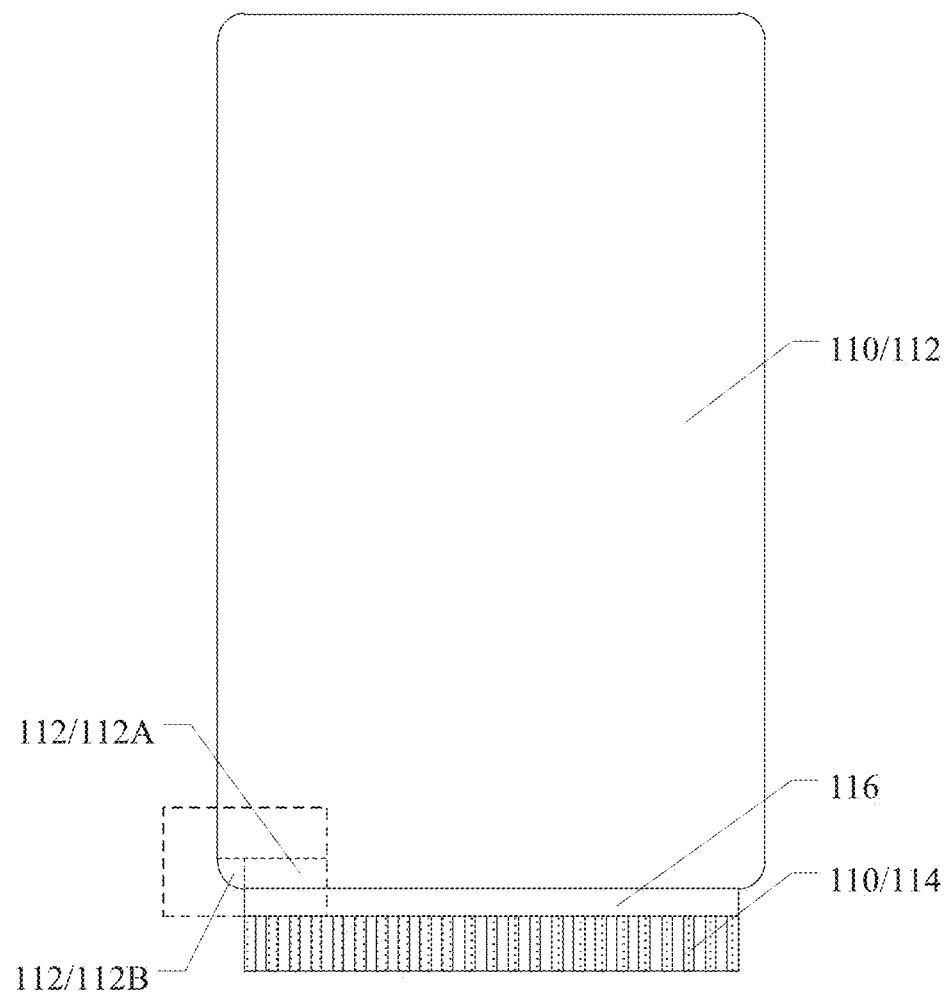
FIG. 2 is a schematic plan view of an array substrate provided by an embodiment of the present disclosure.
Figure 3:
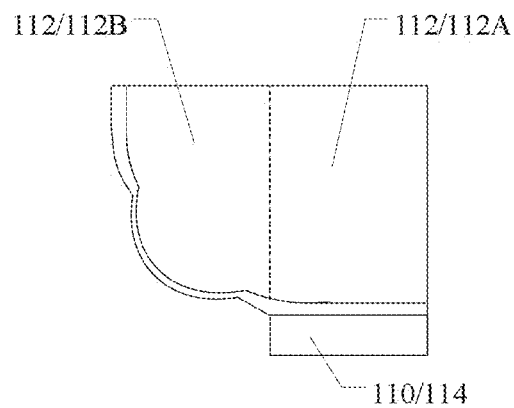
FIG. 3 is an enlarged schematic diagram of a dotted line frame in an array substrate illustrated in FIG. 2.
Figure 4:
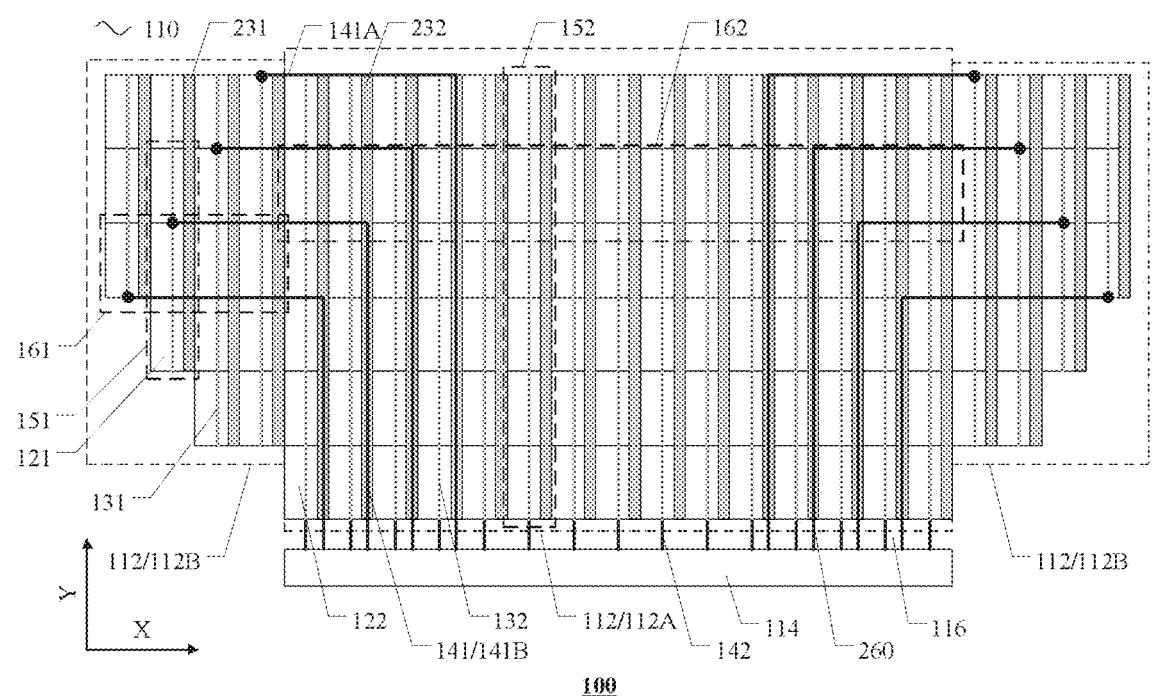
FIG. 4 is a partial schematic diagram of an array substrate provided by an embodiment of the present disclosure.

An embodiment of the present disclosure provides an array substrate. FIG. 2 is a schematic plan view of an array substrate provided by an embodiment of the disclosure; FIG. 3 is an enlarged schematic diagram of a dotted line frame in the array substrate illustrated in FIG. 2; FIG. 4 is a partial schematic diagram of an array substrate provided by an embodiment of the disclosure.

As illustrated by FIG. 2, FIG. 3 and FIG. 4, the array substrate 100 includes a base substrate 110, a plurality of first pixel driving circuits 121, a plurality of first data lines 131 and a plurality of first leads 141; the base substrate 110 includes a display region 112 and a bonding region 114 located around the display region 112. The display region 112 includes a first region 112A and a second region 112B located at a side of the first region 112A, and a plurality of first pixel driving circuits 121 are located in the second region 112B. The first region 112A and the second region 112B are arranged in a first direction. For example, the bonding region 114 can be located below the display region 112, and the bonding region 114 can be used to connect with an external driving IC. The driving IC can provide data signals to a plurality of first data lines 131 through a plurality of first leads 141, thereby driving the array substrate to display.

As illustrated by FIG. 2, FIG. 3 and FIG. 4, the plurality of first pixel driving circuits 121 are arranged in an array along a first direction X and a second direction Y to form a plurality of first pixel driving columns 151 arranged along the first direction X and a plurality of first pixel driving rows 161 arranged along the second direction Y, each of the first pixel driving columns 151 extends along the second direction Y; that is to say, multiple first pixel driving circuits 121 in each of the first pixel driving columns 151 are arranged along the second direction Y. The plurality of first data lines 131 are configured to provide data signals to the first pixel driving columns 151, and the plurality of first leads 141 are respectively connected with the plurality of first data lines 131, pass through the first region 112A from the second region 112B and extend to the bonding region 114. It should be noted that in the array substrate provided by the embodiment of this disclosure, one first data line 131 can drive one first pixel driving column 151, and one first data line 131 can also drive multiple first pixel driving columns 151 by a time-sharing driving mode.

In the array substrate provided by the embodiment of the present disclosure, the plurality of first data lines 131 are configured to provide data signals to the plurality of first pixel driving columns 151, and the plurality of first leads 141 are respectively connected with the plurality of first data lines 131, passing through the first region 112A from the second region 112B and extending to the bonding region 114, so that the plurality of first leads 141 can provide driving signals, such as data signals, to the plurality of first data lines 131. The plurality of first leads 141 pass through the first region 112A from the second region 112B and extend to the bonding region 114, without extending directly from a second region to a bonding region, so the array substrate does not need to set a relatively wide frame outside the second region, so that a narrow frame or even no frame design can be realized outside the second region. In addition, because the plurality of first leads 141 can directly extend from the first region 112A to the bonding region 114, without being bended outside the first region 112A, the width of the frame outside the first region can also be reduced. Therefore, the array substrate has a relatively small frame width at a side of a display region close to the bonding region (i.e., the lower frame), so that a design of narrow frame and ultra-narrow frame can be realized.

On the other hand, because the array substrate has the narrow frame outside the second region, and the narrow frame is not provided with the first lead, the second region of the array substrate can be bent at a large angle, so that a "four-curved screen" design can be realized, and wrinkles can be avoided in a subsequent module bonding process, thereby a product yield is improved. It should be noted that the design of "four-curved screen" is to bend edges and corners of the array substrate according to a certain bending radius and form a radian, so as to realize a full stereoscopic display at a front side and a lateral side of the array substrate, thus realizing a 3D stereoscopic effect of four-curved shape, thus creating a display stereoscopic immersion feeling, which is in line with a future technical development trend.

In some examples, as illustrated by FIG. 2, FIG. 3 and FIG. 4, the second region 112B is closer to an edge of the array substrate 110 than the first region 112A in the first direction X.

In some examples, as illustrated by FIG. 2, FIG. 3 and FIG. 4, a shape of an orthographic projection of the first region 112A on the base substrate 110 is rectangular, and a shape of an orthographic projection of the second region 112B on the base substrate 110 is irregular. Therefore, the array substrate can realize a rounded corner design in the corner, thereby improving a display effect of the array substrate. It should be noted that the irregular shape can be non-rectangular.

In some examples, as illustrated by FIG. 2, FIG. 3 and FIG. 4, an edge of the orthographic projection of the second region 112B on the base substrate 110 includes a curve, and the curve is connected with an edge of an orthographic projection of the first region 112A on the base substrate 110 extending in the first direction X. Therefore, the array substrate can realize an irregular-shaped display region.

For example, as illustrated by FIG. 2, FIG. 3 and FIG. 4, the first region 112A may be a region above a straight edge of a bottom edge of the array substrate 100, and the second region 112B may be located at a corner of the array substrate 100, and a number of sub-pixels in the sub-pixel column in the second region 112B is smaller than that in the first region 112A.

In some examples, as illustrated by FIG. 2, FIG. 3 and FIG. 4, a first overlapping area of an orthographic projection of the bonding region 114 on a reference line 300 extending along the first direction X and an orthographic projection of the first region 112A on the reference line 300 is larger than a second overlapping area of the orthographic projection of the bonding region 114 on the reference line 300 extending along the first direction X and an orthographic projection of the second region 112B on the reference line 300. Even an orthographic projection of the bonding region 114 on the reference line 300 extending along the first direction X is not overlapped with the orthographic projection of the second region 112B on the reference line 300. Therefore, after the first lead comes out of the first region 112A, the first lead can extend to the bonding region 114 without being bended outside the first region 112A, so a width of a frame outside the first region can also be reduced.

In some examples, as illustrated by FIG. 2, FIG. 3 and FIG. 4, each of the first leads 141 includes a first sub-lead portion 141A and a second sub-lead portion 141B; the first sub-lead portion 141A extends in the first direction X, and the second sub-lead portion 141B extends in the second direction Y. The first sub-lead portion 141A extends from the second region 112B to the first region 112A along the first direction X; the second sub-lead portion 141B extends from the first region 112A to the bonding region 114 along the second direction Y. Of course, embodiments of the present disclosure include, but are not limited to, a plurality of first sub-lead portions 141A and a plurality of second sub-lead portions 141B may form a step-shape first lead 141.

In some examples, as illustrated by FIG. 2, FIG. 3 and FIG. 4, two sides of the first region 112A may be provided with the second region 112B, that is to say, one second region 112B is provided on a first side of the first region 112A, and another second region 112B is provided on a second side of the first region 112A opposite to the first side.

In some examples, lengths of the first sub-lead portions 141A of the adjacent first leads 141 are approximately equal, so that the uniformity of resistance or voltage drop of different first leads can be improved. It should be noted that the above-mentioned "approximately equal" includes both a case of complete equality and a case where a difference between the lengths of the two first sub-lead portions is less than $\frac{1}{10}$ of an average length of the two first sub-lead portions.

In some examples, as illustrated by FIG. 2, FIG. 3 and FIG. 4, the array substrate 100 further includes a plurality of second pixel driving circuits 122, a plurality of second data lines 132 and a plurality of second leads 142; the plurality of second pixel driving circuits 122 are located in the first region 112A; the plurality of second pixel driving circuits 122 are arranged in an array along the first direction X and the second direction Y to form a plurality of second pixel driving columns 152 arranged along the first direction X and a plurality of second pixel driving rows 162 arranged along the second direction Y, each of the second pixel driving columns 152 extending along the second direction Y. The plurality of second data lines 132 are configured to provide data signals to the plurality of second pixel driving columns 152, and the plurality of second leads 142 are respectively connected with the plurality of second data lines 132 and extend from the first region 112A to the bonding region 114.

In some examples, as illustrated by FIG. 2, FIG. 3 and FIG. 4, the array substrate 100 further includes a plurality of first power lines 231 and a plurality of second power lines 232; the plurality of first power lines 231 extend along the second direction Y and are at least partially located in the second region 112B; the plurality of second power lines 232 extend along the second direction Y and are at least partially located in the first region 112A; the plurality of first power lines 231 are configured to provide power signals to the plurality of first pixel driving columns 151, and the plurality of second power lines 232 are configured to provide power signals to the plurality of second pixel driving columns 152; an orthographic projection of the second sub-lead portion 141B of each of first leads 141 on the base substrate 110 is at least partially overlapped with an orthographic projection of the second power line 232 on the base substrate 110.

Figure 5:
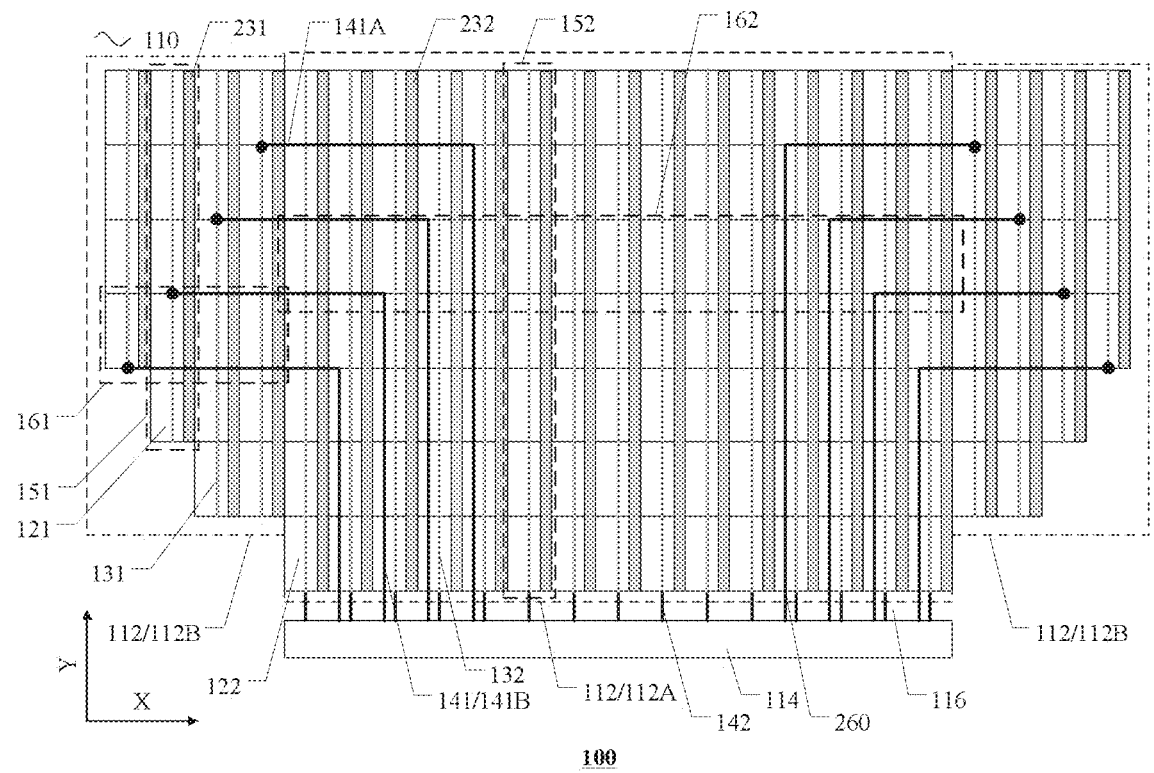
FIG. 5 is a partial schematic diagram of another array substrate provided by an embodiment of the present disclosure.

FIG. 5 is a partial schematic diagram of another array substrate provided by an embodiment of the disclosure. As illustrated by FIG. 5, the orthographic projection of the second sub-lead portion 141B of each of first leads 141 on the base substrate 110 is located between an orthographic projection of the second data line 132 on the base substrate 110 and an orthographic projection of the second power line 232 on the base substrate 110.

In some examples, as illustrated by FIG. 2, FIG. 3 and FIG. 4, in the case where a number of first data lines 131 is M (M is a positive integer greater than or equal to 2) and a number of first leads 141 is M, a number of second data lines 132 is N (N is a positive integer greater than or equal to 2) and a number of second leads 142 is N, for the second region 112B, among the plurality of first leads 141 in the second region 112B, in a direction from the second region 112B to the first region 112A, a first lead 141 connected to an i-th first data line 131 is an i-th first lead 141; among the plurality of second leads 142, in the direction from the second region 112B to the first region 112A, a second lead 142 connected to an i-th second data line 132 is an i-th second lead 142; a second sub-lead portion 141B of the i-th first lead 141 is located between the i-th second lead 142 and an (i+1)-th second lead 143, and i is a positive integer greater than or equal to 1 and less than or equal to M. That is to say, the second sub-lead portion 141B of the i-th first lead 141 can be inserted between the i-th second lead 142 and the (i+1)-th second lead 143. In this case, the array substrate can be driven by adjusting a structure or driving method of the driving IC.

Figure 6:
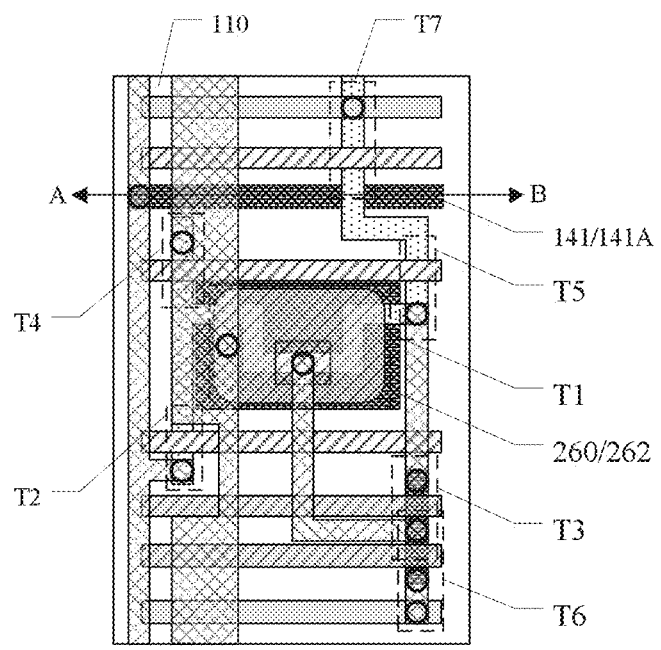
FIG. 6 is a partial schematic diagram of another array substrate provided by an embodiment of the present disclosure.

FIG. 6 is a partial schematic diagram of another array substrate provided by an embodiment of the disclosure. As illustrated by FIG. 6, the first pixel driving circuit 121 includes a driving transistor T1; the array substrate 100 also includes a light shielding structure 262; the light shielding structure 262 is located at a side of the plurality of first pixel driving circuits 121 close to the base substrate 110, that is to say, the light shielding structure 262 is located below the plurality of first pixel driving circuits 121; an orthographic projection of the driving transistor T1 of the first pixel driving circuit 121 on the base substrate 110 is at least partially overlapped with an orthographic projection of the light shielding structure 262 on the base substrate 110, thereby preventing light from irradiating the driving transistor T1 and improving the electrical performance of the driving transistor T1. In this case, the array substrate can use a light shielding layer 260 where the light shielding structure 262 is located to form the plurality of first leads 141. That is to say, the plurality of first leads 141 and the light shielding structure 262 are arranged in a same layer. It should be noted that the above-mentioned arrangement of the plurality of first leads and the light shielding structure in the same layer means that the plurality of first leads and the light shielding structure are formed by a same film layer and a same masking process.

In the array substrate provided by this example, the above-mentioned plurality of first leads are formed by using the light shielding layer where the light shielding structure is located, and the array substrate has the following beneficial technical effects: (1) because the first leads are made of a material of the light shielding layer (for example, molybdenum metal) and the square resistance of the material of the light shielding layer itself is relatively low, the resistance of the first leads can be reduced by adopting the material of the light shielding layer to manufacture the first leads; (2) because a distance between the light shielding layer where the light shielding structure is located and a film layer where the data line or other signal lines are located is far, the arrangement that the first lead and the light shielding structure are disposed in the same layer can reduce the crosstalk between the first lead and the signal lines in the display region; (3) because the first lead is located in the shielding layer, a size of the first lead is not limited by a size of the first pixel driving circuit and the second pixel driving circuit, so it can be applied to products with different pixels per inch (PPI); (4) the first lead and the light shielding structure can adopt the same masking process, so that the masking process will not be increased, thereby reducing a cost.

For example, the material of the light shielding structure can be selected from one or more of molybdenum and titanium. Of course, the embodiments of the present disclosure include but are not limited thereto, and other conductive materials with shielding performance can also be selected as the material of the shielding structure.

In some examples, as illustrated by FIG. 6, the driving transistor T1 includes a channel region C1, and an orthographic projection of the channel region C1 on the base substrate 110 completely falls within an orthographic projection of the light shielding structure 262 on the base substrate 110, and each of the first leads 141 is spaced apart from and insulated from the light shielding structure 262.

In some examples, as illustrated by FIG. 6, the first pixel driving circuit 121 further includes a compensation transistor T3 and an initialization transistor T6, a first electrode of the compensation transistor T3, a first electrode of the initialization transistor T6 and a gate electrode of the driving transistor T1 are connected to a first node N1; an active layer of the compensation transistor T3 and an active layer of the initialization transistor T6 are made of oxide semiconductor material, and an active layer of the driving transistor T1 is made of low-temperature polysilicon material. Therefore, a transistor whose active layer is made of oxide semiconductor material has the characteristics of good hysteresis and low leakage current (less than $1e^{-14}$ A), and in this case, the mobility is also lower, which can realize relatively low leakage current. The array substrate can ensure a voltage stability on the gate electrode of the driving transistor T1 by adopting oxide semiconductor material as the material of the active layer of the compensation transistor T3 and the active layer of the initialization transistor T6. On the other hand, because the driving transistor T1 needs higher mobility and more stable source voltage, it is possible to use a low-temperature polycrystalline silicon (LTPS) type transistor.

In some examples, as illustrated by FIG. 6, the first pixel drive circuit 121 further includes a data writing transistor T2, a first light emission control transistor T4, a second light emission control transistor T5, and an electrode reset transistor T7. Therefore, the driving circuit can adopt a 7T1C structure, and in this case, the pixel driving circuit 121 can also include a storage capacitor Cst. It should be noted that a structure and a layout relationship of the first pixel driving circuit illustrated in FIG. 6 is only an example of the first pixel driving circuit according to the embodiment of the present disclosure, and the first pixel driving circuit can also adopt other suitable structures. In addition, the structure and layout relationship of the second pixel driving circuit may be the same as or different from that of the first pixel driving circuit.

Figure 7:
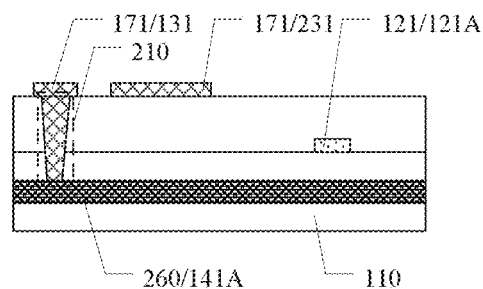
FIG. 7 is a schematic sectional view of an array substrate along an AB direction in FIG. 6 according to an embodiment of the present disclosure.

FIG. 7 is a schematic cross-sectional view of an array substrate along a direction AB in FIG. 6 according to an embodiment of the disclosure. As illustrated by FIG. 6 and FIG. 7, the array substrate 100 includes a first conductive layer 171 and a first via connection structure 210; the first conductive layer 171 is located at a side of the plurality of first pixel driving circuits 121 away from the base substrate 110; a plurality of first data lines 131 are located in the first conductive layer 171, and each of the first leads 141 is connected with a corresponding first data line 131 through the first via connection structure 210.

Figure 8:
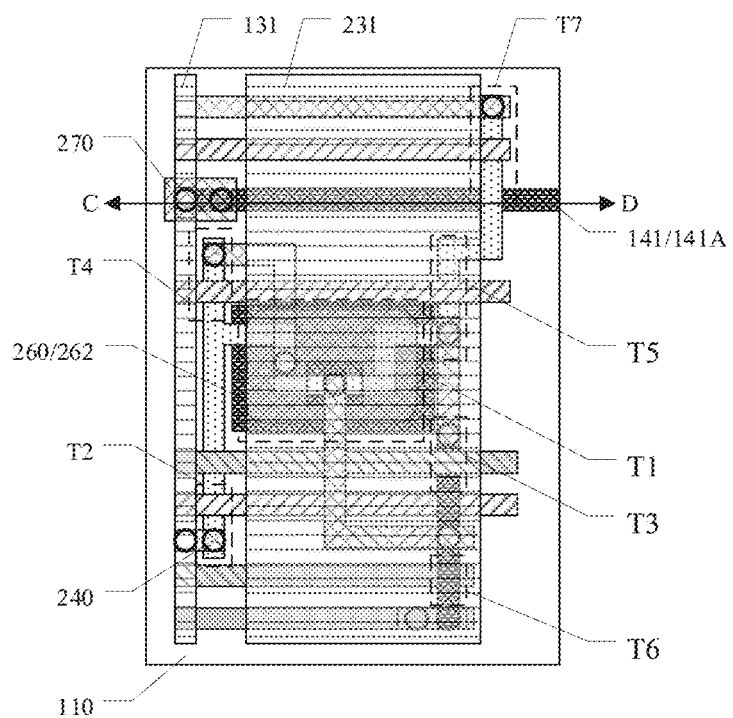
FIG. 8 is a partial schematic diagram of another array substrate provided by an embodiment of the present disclosure.
Figure 9:
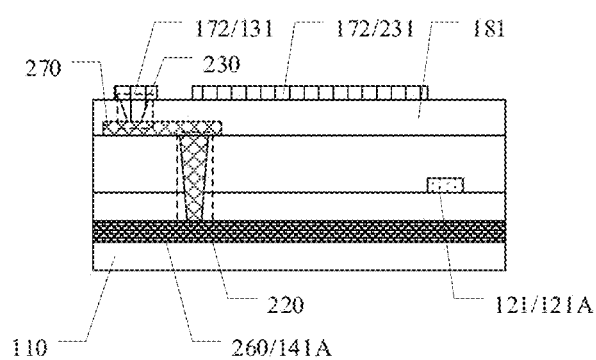
FIG. 9 is a schematic sectional view of an array substrate along an CD direction in FIG. 8 according to an embodiment of the present disclosure.

FIG. 8 is a partial schematic diagram of another array substrate provided by an embodiment of the disclosure; FIG. 9 is a schematic cross-sectional view of an array substrate along a direction CD in FIG. 8 according to an embodiment of the disclosure. As illustrated by FIG. 8 and FIG. 9, the array substrate 100 further includes a first conductive layer 171, a first planarization layer 181 and a second conductive layer 172. The first conductive layer 171 is located at a side of the plurality of first pixel driving circuits 121 away from the base substrate 110; the first planarization layer 181 is located at a side of the first conductive layer 171 away from the first pixel driving circuits 121. The second conductive layer 172 is located at a side of the first planarization layer 181 away from the first conductive layer 171. The array substrate 100 also includes a second via connection structure 220 and a third via connection structure 230. The third via connection structure 230 is located in the first planarization layer 181. A plurality of first data lines 131 are located in the second conductive layer 172. The first conductive layer 171 includes a connection electrode 270. Each of the first leads 141 is connected to the connection electrode 270 through the second via connection structure 220, and the connection electrode 270 are connected to the corresponding first data line 131 through the third via connection structure 230. Therefore, the array substrate can form the first data line in the second conductive layer, thereby reducing the load of the first data line and reducing a crosstalk between the first data line and other signal lines. The array substrate 100 includes a driving transistor T1 and a data writing transistor T2, one of the plurality of first data lines 131 is connected with a first electrode of the data writing transistor T2 through a fourth via connection structure 240, and the third via connection structure 230 and the fourth via connection structure 240 are not located on the same straight line.

Figure 10:
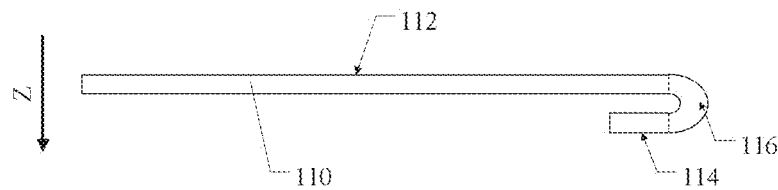
FIG. 10 is a schematic diagram of another array substrate provided by an embodiment of the present disclosure.

FIG. 10 is a schematic diagram of another array substrate provided by an embodiment of the disclosure. As illustrated by FIG. 10, the base substrate 110 further includes a bending region 116 located between the first region 112A and the bonding region 114; the bending region 116 is bent so that the bonding region 114 and the first region 112A are located at both sides of the base substrate 110 in a third direction Z, the third direction Z is perpendicular to both the first direction X and the second direction Y. That is to say, the base substrate may include a display side and a back side opposite to the display side, the first region and the second region may be located at the display side, and the bending region is bent to the back side so that the bonding region is located at the back side. Therefore, the array substrate can further reduce the width of the frame, thereby realizing the ultra-narrow frame design.

For example, the base substrate 110 can be a flexible substrate, and the base substrate 110 can be made of flexible materials such as polyimide.

Figure 11:
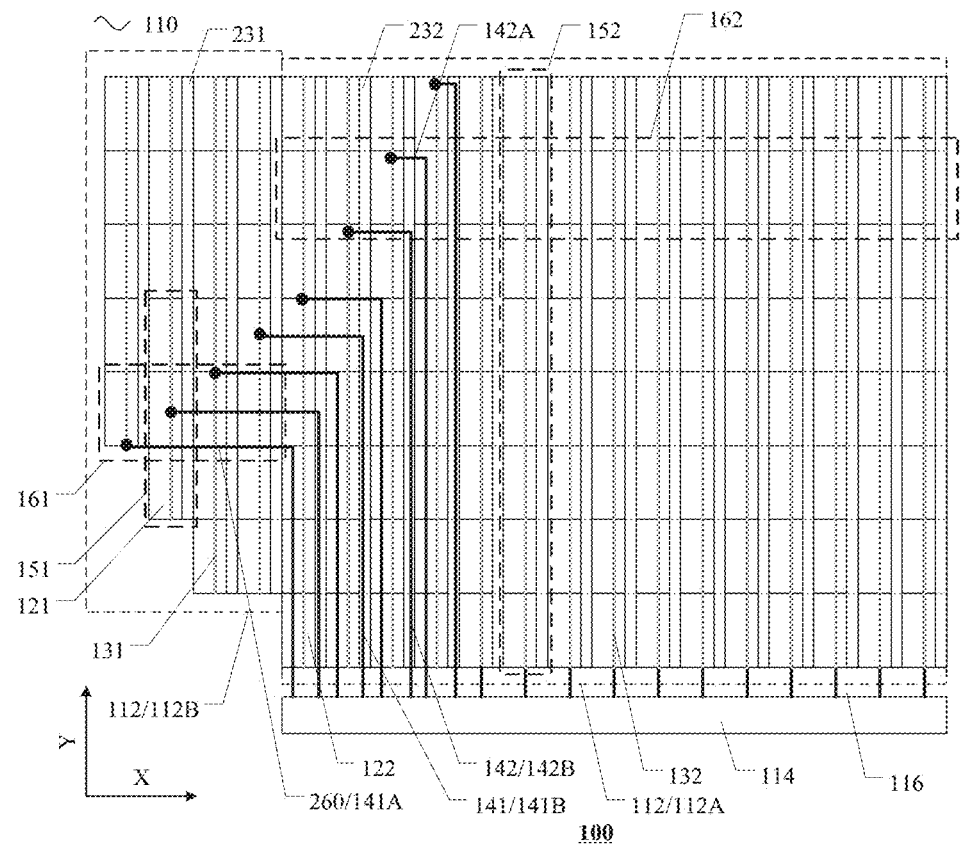
FIG. 11 is a schematic diagram of another array substrate according to an embodiment of the present disclosure.

FIG. 11 is a schematic diagram of another array substrate provided by an embodiment of the disclosure. As illustrated by FIG. 11, the array substrate 100 includes a base substrate 110, a plurality of first pixel driving circuits 121, a plurality of second pixel driving circuits 122, M first data lines 131, N second data lines 132, M first leads 141 and N second leads 142; the base substrate 110 includes a display region 112 and a bonding region 114 located around the display region 112. The display region 112 includes a first region 112A and a second region 112B located at a side of the first region 112A, and a plurality of first pixel driving circuits 121 are located in the second region 112B. A plurality of first pixel driving circuits 122 are located in the first region 112A.

In some examples, as illustrated by FIG. 11, a plurality of first pixel driving circuits 121 are arranged in an array along a first direction X and a second direction Y to form a plurality of first pixel driving columns 151 arranged along the first direction X, and each of the first pixel driving columns 151 extends along the second direction Y; that is to say, the first pixel driving circuits 121 in each of the first pixel driving columns 151 are arranged along the second direction Y. The M first data lines 131 are configured to provide data signals to the plurality of first pixel driving columns 151, and the M first leads 141 are respectively connected to the M first data lines 131, pass through the first region 112A from the second region 112B and extend to the bonding region 114. The plurality of second pixel driving circuits 122 are arranged in an array along the first direction X and the second direction Y to form a plurality of second pixel driving columns 152 arranged along the first direction X, and each of the second pixel driving columns 152 extends along the second direction Y. The N second data lines 132 are configured to provide data signals to the plurality of second pixel driving columns 152, and the N second leads 142 are respectively connected with the N second data lines 132 and extend from the first region 112A to the bonding region 114.

In some examples, as illustrated by FIG. 11, each of the first leads 141 includes a first sub-lead portion 141A and a second sub-lead portion 141B; the first sub-lead portion 141A extends along the first direction X, and the second sub-lead portion 141B extends along the second direction Y. Among the N second leads 142, in a direction from the second region 112B to the first region 112A, a second lead 142 connected to a j-th second data line 132 is a j-th second lead 142, and j is a positive integer greater than or equal to 1 and less than or equal to M; the j-th second lead 142 includes a third sub-lead portion 142A and a fourth sub-lead portion 142B. The third sub-lead portion 142A is located in the first region 112A and extends along the first direction. The fourth sub-lead portion 142B is connected with the third sub-lead portion 142A and extends from the first region 112A to the bonding region 114 along the second direction. Therefore, by arranging the second lead to include the third sub-lead portion and the fourth sub-lead portion, the array substrate can translate the position-portion where the second lead extends from the first region.

In some examples, as illustrated by FIG. 11, among the plurality of first leads 141, a first lead 141 connected to the j-th first data line 131 is a j-th first lead 141; an orthographic projection of a (j+1)-th first lead 141 on the base substrate 110 is located at a side of an orthographic projection of the j-th first lead 141 on the base substrate 110 away from the second region 112B. An orthographic projection of the fourth sub-lead portion 142B of the first second lead 142 on the base substrate 110 is located at a side where an orthographic projection of the second sub-lead portion 141B of a M-th first lead 141 on the base substrate 110 is away from the second region 112B, and an orthographic projection of the fourth sub-lead portion 142B of a (j+1)-th second lead 142 on the base substrate 110 is located at a side where an orthographic projection of a j-th second lead 142 on the base substrate 110 is away from the second region. Therefore, the array substrate can make an order of the second sub-lead portion of the first lead and the fourth sub-lead portion of the second lead the same as that of the first data line and the second data line in the display region, so that it is unneeded to adjust the structure or driving method of the driving IC, thereby reducing the cost.

Figure 12:
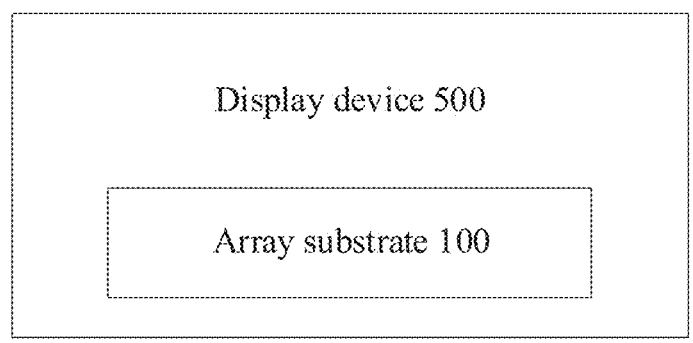
FIG. 12 is a schematic diagram of a display device according to an embodiment of the present disclosure.

At least one embodiment of the present disclosure also provides a display device. FIG. 12 is a schematic diagram of a display device according to an embodiment of the present disclosure. As illustrated by FIG. 12, the display device 500 includes the array substrate 100 described above. Because the array substrate can achieve narrow and ultra-narrow frame design, the display device can also achieve narrow and ultra-narrow frame design. In addition, because the array substrate can realize the "four-curved screen" design, and can also avoid wrinkles in the subsequent module bonding process, it has high product yield. Therefore, the display device can also realize the "four-curved screen" design, and has high product yield.

For example, in some examples, the display device can be any product or component with display function such as smart phone, tablet computer, TV set, monitor, notebook computer, digital photo frame, navigator, etc.

The following points need to be explained:

(1) In the drawings of the embodiments of the present disclosure, only the structures related to the embodiments of the present disclosure are involved, and other structures can refer to the general design.

(2) The features of the same embodiment and different embodiments of the present disclosure can be combined with each other without conflict.

The above are only the specific embodiments of this disclosure, but the scope of protection of the present disclosure is not limited thereto. Any skilled in the art can easily think of changes or substitutions within the technical scope disclosed in the present disclosure, which should be covered by the scope of protection of this disclosure. Therefore, the scope of protection of the present disclosure should be based on the scope of protection of the claims.

What is claimed is:

1. An array substrate, comprising:
   a base substrate, comprising a display region and a bonding region located around the display region;
   a plurality of first pixel driving circuits located on the base substrate;
   a plurality of first data lines; and
   a plurality of first leads,
   wherein the display region comprises a first region and a second region located at a side of the first region, and the plurality of first pixel driving circuits are located in the second region,
   the plurality of first pixel driving circuits are arranged in an array along a first direction and a second direction to form a plurality of first pixel driving columns arranged along the first direction, the first region and the second region are arranged in the first direction,
   the plurality of first data lines are configured to provide data signals to the plurality of first pixel driving columns, and the plurality of first leads are respectively connected with the plurality of first data lines, and at least partially located in the first region and the second region.

2. The array substrate according to claim 1, wherein each of the first pixel driving circuits comprises a driving transistor, and the array substrate further comprises:
   a light shielding structure located at a side of the plurality of first pixel driving circuits close to the base substrate,
   wherein, an orthographic projection of the driving transistor of each of the first pixel driving circuits on the base substrate is at least partially overlapped with an orthographic projection of the light shielding structure on the base substrate,
   the driving transistor comprises a channel region, an orthographic projection of the channel region on the base substrate completely falls within an orthographic projection of the light shielding structure on the base substrate, an orthographic projection of each of the first leads on the base substrate is not overlapped with an orthographic projection of the light shielding structure on the base substrate.

3. The array substrate according to claim 2, further comprising:
   a first conductive layer, located at a side of the plurality of first pixel driving circuits away from the base substrate; and
   a first via connection structure,
   wherein, the plurality of first data lines are located in the first conductive layer, and each of the first leads is connected with a corresponding one of the first data lines through the first via connection structure.

4. The array substrate according to claim 2, further comprising:
   a first conductive layer, located at a side of the plurality of first pixel driving circuits away from the base substrate;
   a first planarization layer, located at a side of the first conductive layer away from the base substrate;
   a second conductive layer, located at a side of the first planarization layer away from the base substrate; and
   a third via connection structure, located in the first planarization layer,
   wherein the plurality of first data lines are located in the second conductive layer, and the first conductive layer comprises a connection electrode, each of the first leads is connected with the connection electrode, and the connection electrode is connected with a corresponding one of the first data lines through the third via connection structure.

5. The array substrate according to claim 4, further comprising:
   a second via connection structure; and
   wherein the first conductive layer comprises a connection electrode, each of the leads is connected with the connection electrode through the second via connection structure.

6. The array substrate according to claim 4, wherein each of the first leads comprises:
   a first sub-lead portion, extending from the second region to the first region along the first direction; and
   a second sub-lead portion, extending from the first region to the bonding region along the second direction.

7. The array substrate according to claim 6, wherein the first sub-lead portion is located at a side of a film layer where the plurality of first data lines are located close to the base substrate.

8. The array substrate according to claim 6, wherein an extending direction of the first sub-lead portion is approximately same as an extending direction of the connection electrode.

9. The array substrate according to claim 6, further comprising:
   a plurality of second pixel driving circuits located in the first region; and
   a plurality of first power lines extending along the second direction and at least partially located in the second region; and
   a plurality of second power lines extending along the second direction and at least partially located in the first region,
   wherein, the plurality of first pixel driving circuits are arranged in an array along a first direction and a second direction to form a plurality of first pixel driving rows arranged along the second direction and a plurality of first pixel driving columns arranged along the first direction, and the plurality of second pixel driving circuits are arranged in an array along a first direction and a second direction to form a plurality of second pixel driving rows arranged along the second direction and a plurality of second pixel driving columns arranged along the first direction,
   the first power lines are configured to provide power signals to the first pixel driving columns, the second power lines are configured to provide power signals to the second pixel driving columns,
   an orthographic projection of the first sub-lead portion of each of the first leads on the base substrate is at least partially overlapped with an orthographic projection of one of the second power lines on the base substrate.

10. The array substrate according to claim 6, further comprising:
a plurality of second pixel driving circuits located in the first region;
a plurality of second data lines;
a plurality of first power lines extending along the second direction and at least partially located in the second region; and
a plurality of second power lines extending along the second direction and at least partially located in the first region,
wherein, the plurality of first pixel driving circuits are arranged in an array along a first direction and a second direction to form a plurality of first pixel driving rows arranged along the second direction and a plurality of first pixel driving columns arranged along the first direction, and the plurality of second pixel driving circuits are arranged in an array along a first direction and a second direction to form a plurality of second pixel driving rows arranged along the second direction and a plurality of second pixel driving columns arranged along the first direction,
the plurality of second data lines are configured to provide data signals to the plurality of second pixel driving columns, the plurality of first power lines are configured to provide power signals to the plurality of first pixel driving columns, the plurality of second power lines are configured to provide power signals to the plurality of second pixel driving columns,
an orthographic projection of the second sub-lead portion of each of the first leads on the base substrate is located between an orthographic projection of one of the second data lines on the base substrate and an orthographic projection of one of the second power lines on the base substrate.

11. The array substrate according to claim 6, wherein an orthographic projection of the connection electrode on the base substrate is not overlapped with orthographic projections of the first power lines and/or the second power lines on the base substrate.

12. The array substrate according to claim 6, wherein lengths of first sub-lead portions of adjacent ones of first leads are approximately equal.

13. The array substrate according to claim 10, wherein each of the first pixel driving circuits further comprises a compensation transistor and an initialization transistor, a first electrode of the compensation transistor, a first electrode of the initialization transistor and a gate electrode of the driving transistor are connected to a first node,
an active layer of the compensation transistor and an active layer of the initialization transistor are made of an oxide semiconductor material, and an active layer of the driving transistor is made of a low-temperature polysilicon material.

14. The array substrate according to claim 13, wherein orthographic projections of the first power lines and/or the second power lines on the base substrate cover an orthographic projection of the compensation transistor on the base substrate and an orthographic projection of the initialization transistor on the base substrate.

15. The array substrate according to claim 13, further comprising:
a driving transistor and a data writing transistor,
wherein one of the plurality of first data lines is connected with a first electrode of the data writing transistor through a fourth via connection structure, and the third via connection structure and the fourth via connection structure are not located on the same straight line.

16. The array substrate according to claim 1, wherein the second region is closer to an edge of the array substrate than the first region in the first direction.

17. The array substrate according to claim 16, wherein an edge of an orthographic projection of the second region on the base substrate comprises a curve, and the curve is connected with an edge of an orthographic projection of the first region on the base substrate extending in the first direction.

18. The array substrate according to claim 1, wherein a first overlapping area of an orthographic projection of the bonding region on a reference line extending along the first direction and an orthographic projection of the first region on the reference line is larger than a second overlapping area of an orthographic projection of the bonding region on the reference line extending along the first direction and an orthographic projection of the second region on the reference line.

19. The array substrate according to claim 18, wherein the base substrate further comprises a bending region located between the first region and the bonding region, and the bending region is bent so that the bonding region and the first region are located at both sides of the base substrate in the third direction, and the third direction is perpendicular to both the first direction and the second direction.

20. A display device, comprising the array substrate according to claim 1.

* * * * *